(12) United States Patent
Huang

(10) Patent No.: US 12,543,446 B2
(45) Date of Patent: Feb. 3, 2026

(54) DISPLAY PANEL AND MANUFACTURING METHOD THEREOF, AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventor: Wentong Huang, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 555 days.

(21) Appl. No.: 17/998,298

(22) PCT Filed: Oct. 22, 2021

(86) PCT No.: PCT/CN2021/125629
§ 371 (c)(1),
(2) Date: Nov. 9, 2022

(87) PCT Pub. No.: WO2022/227437
PCT Pub. Date: Nov. 3, 2022

(65) Prior Publication Data
US 2023/0217727 A1 Jul. 6, 2023

(30) Foreign Application Priority Data
Apr. 28, 2021 (CN) .......................... 202110467134.4

(51) Int. Cl.
H10K 59/122 (2023.01)
H10K 59/12 (2023.01)
H10K 71/13 (2023.01)

(52) U.S. Cl.
CPC ....... H10K 59/122 (2023.02); H10K 59/1201 (2023.02); H10K 71/135 (2023.02)

(58) Field of Classification Search
CPC ............ H10K 59/122; H10K 59/1201; H10K 71/135; H10K 50/11; H10K 50/15;
(Continued)

(56) References Cited

U.S. PATENT DOCUMENTS

2014/0184683 A1 7/2014 Harjee et al.
2018/0130845 A1 5/2018 Ko et al.
(Continued)

FOREIGN PATENT DOCUMENTS

CN 107579099 A * 1/2018
CN 107819080 A 3/2018
(Continued)

OTHER PUBLICATIONS

English Translation of CN 107579099 A (Year: 2018).*
Chinese Patent Application No. 202110467134.4, Notification to Grant Patent Right for Invention, Jun. 6, 2022.

Primary Examiner — Sue A Purvis
Assistant Examiner — Carnell Hunter, III
(74) Attorney, Agent, or Firm — DINSMORE & SHOHL LLP

(57) ABSTRACT

Provided are a display panel and a manufacturing method thereof, and a display device. The display panel includes: a base substrate; anodes and a mark pattern including at least one first mark pattern; a pixel defining layer having openings, wherein the orthographic projection of each opening on the base substrate at least partially overlaps with that of a corresponding anode, and the orthographic projection of the mark pattern on the base substrate is located within that of the pixel defining layer; at least one group of ink droplets including one or more ink droplets, and the orthographic projection of each ink droplet on the base substrate is located within that of the pixel defining layer; a functional layer including at least one sub-layer including a light-emitting (Continued)

layer, and the material of each group of ink droplets is the same as that of a sub-layer; and a cathode.

20 Claims, 5 Drawing Sheets

(58) Field of Classification Search
CPC .. H10K 50/17; H10K 71/00; B41J 2/01; B41J 3/407
See application file for complete search history.

(56) References Cited

U.S. PATENT DOCUMENTS

| | | |
|---|---|---|
| 2018/0315800 A1 | 11/2018 | Iguchi et al. |
| 2019/0123116 A1 | 4/2019 | Wang et al. |
| 2021/0376294 A1 | 12/2021 | Wang |
| 2022/0223668 A1 | 7/2022 | Cui |
| 2022/0359635 A1 | 11/2022 | Han et al. |

FOREIGN PATENT DOCUMENTS

| | | | |
|---|---|---|---|
| CN | 109935741 A | 6/2019 | |
| CN | 110047866 A | 7/2019 | |
| CN | 110707128 A | 1/2020 | |
| CN | 111293152 A | 6/2020 | |
| CN | 111370458 A | 7/2020 | |
| CN | 111613650 A | 9/2020 | |
| CN | 113224119 A | 8/2021 | |

\* cited by examiner

DISPLAY PANEL AND MANUFACTURING METHOD THEREOF, AND DISPLAY DEVICE

CROSS-REFERENCE TO RELATED APPLICATIONS

The present application is a U.S. National Stage Application under 35 U.S.C. § 371 of International Patent Application No. PCT/CN2021/125629, filed on Oct. 22, 2021, which claims priority to China Patent Application No. 202110467134.4 filed on Apr. 28, 2021, the disclosures of both of which are incorporated by reference herein in their entireties.

TECHNICAL FIELD

The present disclosure relates to a display panel and a manufacturing method thereof, and a display device.

BACKGROUND

Compared with a traditional liquid crystal display panel, in addition to smaller weight and thinness, the OLED (Organic Light Emission Diode) display panel also has the advantages of self-illumination, low power consumption, backlight-free, fast response speed, and without limitation in a viewing angle and thus has broad application prospects.

SUMMARY

According to one aspect of the embodiments of the present disclosure, a display panel is provided. The display panel comprises: a base substrate; a plurality of anodes and a marking pattern which are located on one side of the base substrate, wherein the marking pattern comprises at least one first marking pattern; a pixel defining layer located on the one side of the base substrate, and defining a plurality of openings, wherein an orthographic projection of each opening of the plurality of openings on the base substrate at least partially overlaps with an orthographic projection of an anode of the plurality of anodes corresponding to the each opening on the base substrate, and an orthographic projection of the marking pattern on the base substrate is within an orthographic projection of the pixel defining layer on the base substrate; at least one group of ink droplets located on one side of the pixel defining layer away from the base substrate, wherein each group of ink droplets comprises one or more ink droplets, and an orthographic projection of each ink droplet of the one or more ink droplets on the base substrate is located within the orthographic projection of the pixel defining layer on the base substrate; a functional layer located on one side of each anode of the plurality of anodes away from the base substrate, wherein the functional layer comprises at least one sub-layer comprising a light-emitting layer, and a material of each group of ink droplets is the same as a material of one of the at least one sub-layer; and a cathode located on one side of the functional layer away from the base substrate.

In some embodiments, an orthographic projection of each first marking pattern on the base substrate is of a first shape; and the marking pattern further comprises at least one second marking pattern, wherein an orthographic projection of each second marking pattern on the base substrate is of a second shape different from the first shape.

In some embodiments, the plurality of openings comprises M×N openings, wherein M is a row number of the plurality of openings, N is a column number of the plurality of openings, and M and N each is an integer greater than or equal to 2; the at least one first marking pattern comprises a plurality of first marking patterns comprising M'×N' first marking patterns, wherein two adjacent rows of first marking patterns are spaced apart by at least one row of openings, two adjacent columns of first marking patterns are spaced apart by at least one column of openings, M' is a row number of the plurality of first marking patterns, N' is a column number of the plurality of first marking patterns, and M' and N' each is an integer greater than or equal to 2; and the at least one second marking pattern comprises a plurality of second marking patterns.

In some embodiments, each second marking pattern comprises a first marking sub-pattern and a second marking sub-pattern; and only one of the plurality of first marking patterns is located between the first marking sub-pattern and the second marking sub-pattern.

In some embodiments, wherein an area of an orthographic projection of each of the first marking sub-pattern and the second marking sub-pattern on the base substrate is smaller than an area of the orthographic projection of each first marking pattern on the base substrate, wherein: the first marking sub-pattern is located in a same row as one row of openings of the plurality of openings, and the second marking sub-pattern is located in a same row as another row of openings of the plurality of openings adjacent to the one row of openings, or the first marking sub-pattern is located in a same column as one column of openings of the plurality of openings, and the second marking sub-pattern is located in a same column as another column of openings of the plurality of openings adjacent to the one column of openings.

In some embodiments, wherein a distance between geometric centers of orthographic projections of any two adjacent first marking patterns in a same row of first marking patterns on the base substrate is a same first distance.

In some embodiments, a distance between geometric centers of orthographic projections of any two adjacent openings in a same row of openings on the base substrate is the same first distance.

In some embodiments, a distance between geometric centers of orthographic projections of any two adjacent first marking patterns in a same column of first marking patterns on the base substrate is a same second distance.

In some embodiments, a distance between geometric centers of orthographic projections of any two adjacent openings in a same column of openings on the base substrate is the same second distance.

In some embodiments, M=M', N=N', M rows of openings and M' rows of first marking patterns are alternately arranged, and N columns of openings and N' columns of first marking patterns are alternately arranged.

In some embodiments, in a case where i is any value from 1 to M, a number of openings in i-th row of openings is the same as a number of first marking patterns in i-th row of the first marking patterns; and in a case where j is any value from 1 to N, a number of openings in j-th column of openings is the same as a number of the first marking patterns in j-th column of the first marking patterns.

In some embodiments, wherein an orthographic projection of each ink droplet on the base substrate does not overlap with an orthographic projection of each first marking pattern on the base substrate.

In some embodiments, the at least one sub-layer further comprises a hole injection layer, and a hole transport layer located between the hole injection layer and the light-emitting layer; and the at least one group of ink droplets comprises a first group of ink droplets, a second group of ink droplets and a third group of ink droplets that do not overlap each other, wherein a material of the first group of ink droplets is the same as a material of the light-emitting layer, a material of the second group of ink droplets is the same as a material of the hole injection layer, and a material of the third group of ink droplets is the same as a material of the hole transport layer.

In some embodiments, the orthographic projection of each ink droplet on the base substrate is of the first shape, and the first shape is a circle.

In some embodiments, the marking pattern is located in a same layer as the plurality of anodes.

According to another aspect of the embodiments of the present disclosure, a display device is provided. The display device comprises the display panel according to any one of the above embodiments.

According to a further aspect of the embodiments of the present disclosure, a manufacturing method of a display panel is provided. The manufacturing method comprises: providing a substrate structure located on a carrier, the substrate structure comprising: a base substrate, a plurality of anodes and a marking pattern which are located on one side of the base substrate, wherein the marking pattern comprises at least one first marking pattern, and a pixel defining layer located on the one side of the base substrate, and defining a plurality of openings, wherein an orthographic projection of each opening of the plurality of openings on the base substrate at least partially overlaps with an orthographic projection of an anode of the plurality of anodes corresponding to the each opening on the base substrate, and an orthographic projection of the marking pattern on the base substrate is within an orthographic projection of the pixel defining layer on the base substrate; printing a functional layer on one side of each anode of the plurality of anodes away from the base substrate using a print head, wherein the functional layer comprises at least one sub-layer comprising a light-emitting layer; forming a cathode on one side of the functional layer away from the base substrate; and before printing one of the at least one sub-layer, correcting at least one of the print head or the carrier. The correcting at least one of the print head or the carrier comprises: printing a group of ink droplets on one side of the pixel defining layer away from the base substrate using the print head with at least one first position desired to be printed as a target position, wherein the group of ink droplets comprises one or more ink droplets, a material of the group of ink droplets is the same as a material of the one of the at least one sub-layer, one ink droplet corresponds to one first position, and an orthographic projection of each ink droplet of the one or more ink droplets on the base substrate is located within the orthographic projection of the pixel defining layer on the base substrate; obtaining at least one second position of the group of ink droplets actually printed, wherein one ink droplet corresponds to one second position; and correcting at least one of the print head or the carrier based on a deviation between each second position and a first position corresponding to each second position.

In some embodiments, the at least one first marking pattern comprises a plurality of first marking patterns, and each of the at least one first position is a center of a line segment with end points which are geometric centers of two adjacent first marking patterns of the plurality of first marking patterns.

In some embodiments, the at least one first position comprises a plurality of first positions, and the at least one second position comprises a plurality of second positions;

and the correcting at least one of the print head or the carrier based on a deviation between each second position and a first position corresponding to each second position comprises: determining a first difference between a second abscissa of each second position and a first abscissa of the first position corresponding to each second position to obtain a plurality of first differences; determining a second difference between a second ordinate of each second position and a first ordinate of the first position corresponding to each second position to obtain a plurality of second differences; and correcting at least one of the print head or the carrier based on a first average value of the plurality of first differences and a second average value of the plurality of second differences.

In some embodiments, the correcting at least one of the print head or the carrier based on a deviation between each second position and a first position corresponding to each second position further comprises: determining an angular deviation between each second position and the first position corresponding to each second position according to a ratio of the second difference to the first difference to obtain a plurality of angular deviations; and the correcting at least one of the print head or the carrier based on a first average value of the plurality of first differences and a second average value of the plurality of second differences comprises: correcting at least one of the print head or the carrier based on the first average value, the second average value, and a third average value of the plurality of angular deviations.

Other features, aspects and advantages of the present disclosure will become apparent from the following detailed description of exemplary embodiments of the present disclosure with reference to the accompanying drawings.

BRIEF DESCRIPTION OF THE ACCOMPANYING DRAWINGS

The accompanying drawings, which constitute part of this specification, illustrate exemplary embodiments of the present disclosure and, together with this specification, serve to explain the principles of the present disclosure.

The present disclosure can be more clearly understood from the following detailed description with reference to the accompanying drawings, in which.

Figure 1A:
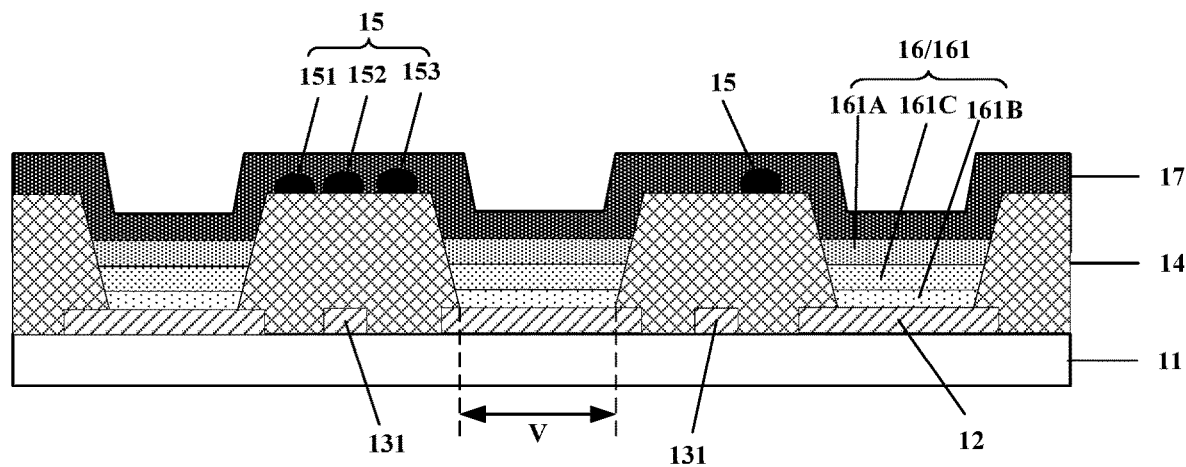
FIG. 1A is a schematic structural view showing a display panel according to an embodiment of the present disclosure.

It should be understood that the dimensions of various parts shown in the accompanying drawings are not necessarily drawn according to actual proportional relations. In

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity, or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, certain layers (for example, a light-emitting layer) in the OLED display panel may be formed by an ink-jet printing process, and certain layers (for example, a cathode) may be formed by an evaporation process.

The inventor has noticed that, in the related art, during the inkjet printing process, the positions of the printed ink droplets are not at desired positions. In some cases, the ink droplets that should be spaced apart are connected to form a bridge, which results in bright lines, dark lines, or color crossover defects (for example, Mura) during the display of the display panel, and reduces the display effect of the display panel.

The inventor has found through studies that, such a condition results from poor match between the print head and the position to be printed of the pixel defining layer, and thus the print head needs to be corrected regularly. However, the inventor has noticed that there is fluctuation in the process of patterning the pixel defining layer, and the positions to be printed of different pixel defining layers are greatly different. The same correction parameter used for the print head may result in deviation of the positions of some ink droplets.

In view of this, the embodiments of the present disclosure provide a display panel adapted to be corrected during the manufacturing process.

Figure 1B:
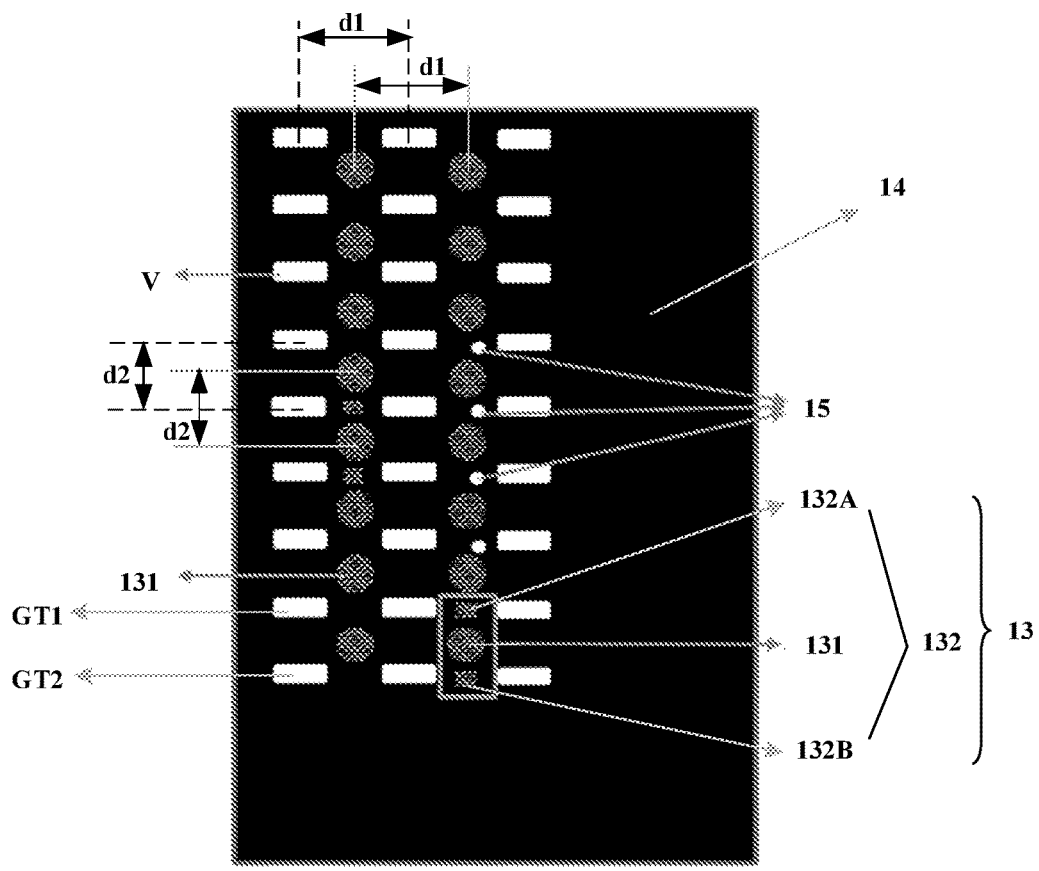
FIG. 1B is a schematic view showing orthographic projections of certain members on a base substrate in a display panel according to an embodiment of the present disclosure.

FIG. 1A is a schematic structural view showing a display panel according to an embodiment of the present disclosure. FIG. 1B is a schematic view showing orthographic projections of certain members on a base substrate in a display panel according to an embodiment of the present disclosure.

As shown in FIGS. 1A and 1B, the display panel comprises a base substrate 11, a plurality of anodes 12, a marking pattern 13, a pixel defining layer 14, at least one group of ink droplets 15, a functional layer 16 and a cathode 17. It should be understood that, a driving circuit layer may be provided between the base substrate 11 and the anode 12, and the driving circuit layer comprises a pixel driving circuit connected to the anode 12.

The base substrate 11 may comprise, for example, a flexible substrate, and the material of the flexible substrate comprises, for example, polyimide (PI) or the like.

The plurality of anodes 12 and the marking pattern 13 are located on one side of the base substrate 11. Here, the marking pattern 13 comprises at least one first marking pattern 131. In some embodiments, the marking pattern 13 is located in a same layer as the plurality of anodes 12, i.e., the marking pattern 13 and the plurality of anodes 12 are formed by patterning a same material layer. For example, the material of the marking pattern 13 comprises a transparent conductive material such as indium tin oxide (ITO).

The pixel defining layer 14 is located on one side of the base substrate 11, and defines a plurality of openings V. The orthographic projection of each opening V on the base substrate 11 at least partially overlaps with the orthographic projection of an anode 12 corresponding to this opening V on the base substrate 11. In some embodiments, the orthographic projection of each opening V on the base substrate 11 is located within the orthographic projection of an anode 12 corresponding to this opening V on the base substrate 11.

The orthographic projection of the marking pattern 13 on the base substrate 11 is located within the orthographic projection of the pixel defining layer 14 on the base substrate 11. In other words, the marking pattern 13 is completely covered by the pixel defining layer 14.

Each group of ink droplets 15 in the display panel is located on one side of the pixel defining layer 14 away from the base substrate 11, that is, located on one surface of the pixel defining layer 14 away from the base substrate 11. Here, each group of ink droplets 15 comprises one or more ink droplets 15, and the orthographic projection of each ink droplet 15 on the base substrate 11 is located within the orthographic projection of the pixel defining layer 14 on the base substrate 11. In other words, the orthographic projection of each ink droplet 15 on the base substrate 11 does not overlap with the orthographic projection of the opening V on the base substrate 11.

The functional layer 16 is located on one side of each anode 12 away from the base substrate 11. Here, the functional layer 16 comprises at least one sub-layer 161. For example, the sub-layer 161 in the functional layer 16 may be formed by an inkjet printing process.

The sub-layer 161 in the functional layer 16 comprises a light-emitting layer 161A. The material of each group of ink droplets 15 is the same as the material of one sub-layer 161 in the functional layer 16. It should be understood that, the ink droplets 15 and the sub-layers 161 of a same material are spaced apart rather than integrated.

For example, the functional layer 16 comprises only the light-emitting layer 161A. In this case, the material of the ink droplets 15 in the display panel is the same as that of the light-emitting layer 161A.

For another example, in addition to the sub-layer of the light-emitting layer 161A, the functional layer 16 also comprises other sub-layers 161. In this case, the materials of different groups of ink droplets 15 in the display panel are the same as the materials of different sub-layers 161.

The cathode 17 is located on one side of the functional layer 16 away from the base substrate 11.

In some embodiments, the cathode 17 is located on one side of each group of ink droplets 15 and the pixel defining layer 14 away from the base substrate 11. In some embodiments, the display panel further comprises an electron transport layer and an electron injection layer between the cathode 17 and the functional layer 16. Here, the electron injection layer is located between the cathode 17 and the electron transport layer. For example, the electron transport layer, the electron injection layer, and the cathode may be formed by an evaporation process.

In the above embodiments, the marking pattern 13 is completely covered by the pixel defining layer 14, and at least one group of ink droplets 15 are located on one side of the pixel defining layer 14 away from the base substrate 11. On one hand, based on the position of the marking pattern 13 and the position of the ink droplets 15, a correction process may be performed during the manufacturing process of the display panel, so that the position of the functional layer 16 formed by inkjet printing is more accurate. On the other hand, the marking pattern 13 and the ink droplets 15 are not located in the openings V of the pixel defining layer 14 and do not affect the functional layer 16. Therefore, such a structure helps to improve the display effect of the display panel.

For example, before inkjet printing the functional layer 16, a target position of the ink droplet 15 desired to be printed may be determined according to the position of the first marking pattern 131. Afterwards, the ink droplet 15 may be printed at the target position using the print head. There might be a deviation between the actual position and the target position of the ink droplet 15. Therefore, the print head or a carrier carrying the display panel can be corrected based on the deviation between the actual position and the target position of the ink droplet 15.

The correction process will be described in detail later in conjunction with the manufacturing method of the display panel.

In some embodiments, the orthographic projection of each ink droplet 15 on the base substrate 11 does not overlap with the orthographic projection of each first marking pattern 131 on the base substrate 11. In this way, the position of the ink droplet 15 can be accurately obtained, and correction can be more accurately performed during the manufacturing process of the display panel.

In some embodiments, referring to FIG. 1A, the functional layer 16 further comprises a hole injection layer 161B, and a hole transport layer 161C between the hole injection layer 161B and the light-emitting layer 161A. In this case, the display panel may comprise a first group of ink droplets 151, a second group of ink droplets 152 and a third group of ink droplets 153. The material of the first group of ink droplets 151 is the same as the material of the light-emitting layer 161A, the material of the second group of ink droplets 152 is the same as the material of the hole injection layer 161B, and the material of the third group of ink droplets 153 is the same as the material of the hole transport layer 161C. The first group of ink droplets 151, the second group of ink droplets 152 and the third group of ink droplets 153 do not overlap with each other. In this way, correction can be more accurately performed before forming the light-emitting layer 161A, the hole injection layer 161B and the hole injection layer 161B based on the position of each group of ink droplets, which helps to further improve the display effect of the display panel.

In some embodiments, the orthographic projection of each first marking pattern 131 on the base substrate 11 is of a first shape. Referring to FIG. 1B, the marking pattern 13 further comprises at least one second marking pattern 132, and the orthographic projection of each second marking pattern 132 on the base substrate 11 is of a second shape different from the first shape. For example, the first shape may be a circle, and the second shape may be other shapes, for example, a rectangle, a square, or the like.

For example, the second marking pattern 132 can be captured as a reference by obtaining an image information comprising the second marking pattern 132, and then a specific first marking pattern 131 (for example, a first marking pattern 131 adjacent to the second marking pattern 132) can be positioned according to the second marking pattern 132, and further a coordinate system is established according to the position of the first marking pattern 131. By using the second marking pattern 132, image processing can be performed more conveniently and rapidly, thereby improving a subsequent correction speed of the display panel.

In some embodiments, referring to FIG. 1B, each second marking pattern 132 comprises a first marking sub-pattern 132A and a second marking sub-pattern 132B. Only one of the plurality of first marking patterns 131 is located between the first marking sub-pattern 132A and the second marking sub-pattern 132B. Such a structure is more convenient to position the first marking pattern 131 and then perform subsequent image processing.

For example, after the second marking pattern 132 is captured, a coordinate system can be established with a geometric center of the first marking pattern 131 located between the first marking sub-pattern 132A and the second marking sub-pattern 132B as an origin, and subsequent processing is further performed.

In some embodiments, the area of the orthographic projection of each of the first marking sub-pattern 132A and the second marking sub-pattern 132B on the base substrate 11 is smaller than the area of the orthographic projection of each first marking pattern 131 on the base substrate 11. That is, the first marker sub-pattern 132A and the second marker sub-pattern 132B occupy a smaller space than the first marking pattern 131.

As some implementations, referring to FIG. 1B, the first marking sub-pattern 132A is located in a same row as one row of openings GT1 in the plurality of openings V, and the second marking sub-pattern 132B is located in a same row as another row of openings GT2 in the plurality of openings V adjacent to the one row of openings GT1. In this case, the first marking sub-pattern 132A and the second marking sub-pattern 132B, each of which occupies a small space, each is located in a same row as a certain row of openings V without affecting normal distribution of the openings V, thus the display effect of the display panel can be improved in the case of ensuring the resolution of the display panel.

As other implementations, the first marking sub-pattern 132A is located in a same column as one column of openings in the plurality of openings V, and the second marking sub-pattern 132B is located in a same column as another column of openings in the plurality of openings V adjacent to the one column of openings. In this case, the first marking sub-pattern 132A and the second marking sub-pattern 132B, each of which occupies a small space, each is located in a same column as a certain column of openings V without affecting normal distribution of the openings V, thus the display effect of the display panel can be improved in the case of ensuring the resolution of the display panel.

In some embodiments, referring to FIG. 1B, the plurality of openings V of the pixel defining layer 14 comprises M×N openings V. Here, M is a row number of the plurality of openings V, N is a column number of the plurality of openings V, and M and N each is an integer greater than or equal to 2. In addition, the marking pattern 13 comprises a plurality of first marking patterns 131 and a plurality of second marking patterns 132, and the plurality of first marking patterns 131 comprises M'×N' first marking patterns 131. Here, M' is a row number of the plurality of first marking patterns 131, N' is a column number of the plurality of first marking patterns 131, and M' and N' each is an integer greater than or equal to 2. For example, one second marking pattern 132 is provided every several first marking patterns 131.

Two adjacent rows of first marking patterns 131 are spaced apart by at least one row of openings V, and two adjacent columns of first marking patterns 131 are spaced apart by at least one column of openings V.

As some implementations, two adjacent rows of first marking patterns 131 are spaced apart by a plurality of rows of openings V, and two adjacent columns of first marking patterns 131 are spaced apart by a plurality of columns of openings V.

As other implementations, two adjacent rows of first marking patterns 131 are spaced apart by only one row of openings V, and two adjacent columns of first marking patterns 131 are spaced apart by only one column of openings V. In this way, there is a larger number of the first marking patterns 131, which is more convenient to obtain the image of the first marking pattern 131, and further perform subsequent correction processing.

In some embodiments, M=M', N=N', M rows of openings V and M' rows of first marking patterns 131 are alternately arranged, and N columns of openings V and N' columns of first marking patterns 131 are alternately arranged. In this case, the first marking pattern 131 is not located in a same row as any one row of openings V and is not located in a same column as any one column of openings V, thereby avoiding affecting the resolution of the pixel panel.

In some embodiments, in a case where i is any value from 1 to M, the number of openings V in the i-th row of openings V is the same as the number of the first marking patterns 131 in the i-th row of first marking patterns 131; and in a case where j is any value from 1 to N, the number of openings V in the j-th column of openings V is the same as the number of the first marking patterns 131 in the j-th column of first marking patterns 131.

For example, the number of openings V in the first row of openings V in is the same as the number of the first marking patterns 131 in the first row of first marking patterns 131, and the number of openings V in the second row of openings V is the same as the number of the second row of first marking patterns 131 in the second row of the first marking patterns 131, and so forth.

Similarly, for example, the number of openings V in the first column of openings V in is the same as the number of the first marking patterns 131 in the first column of first marking patterns 131, and the number of openings V in the second column of openings V is the same as the number of the second column of first marking patterns 131 in the second column of the first marking patterns 131, and so forth.

In the above embodiments, each opening is correspondingly provided with one first marking pattern, thus any region of the display panel may be selected when the image of the first marking pattern 131 is selected, which is more flexible.

In some embodiments, referring to FIG. 1B, the distance between the geometric centers of the orthographic projections of any two adjacent first marking patterns 131 in a same row of the first marking patterns 131 on the base substrate 11 is a same first distance d1. In this way, the first marking patterns 131 are evenly distributed, which is more convenient to determine the positions of the printed ink droplets before printing the functional layer according to the positions of the first marking patterns 131.

In some embodiments, the distance between the geometric centers of the orthographic projections of any two adjacent openings V in a same row of openings V on the base substrate 11 is the same first distance d1. That is, the distribution of each row of openings V is the same as the distribution of each row of the first marking patterns 131, thus some first marking patterns 131 can be more flexibly selected for correction process.

In some embodiments, the distance between the geometric centers of the orthographic projections of any two adjacent first marking patterns 131 in a same column of the first marking patterns 131 on the base substrate 11 is a same second distance d2. In this way, the distribution of the first marking patterns 131 is more uniform, which is more convenient to determine the positions of the printed ink droplets before printing the functional layer according to the positions of the first marking patterns 131.

In some embodiments, the distance between the geometric centers of the orthographic projections of any two adjacent openings V in a same column of openings V on the base substrate 11 is the same second distance d2. That is, the distribution of each column of openings V is the same as the distribution of each column of the first marking patterns 131, thus some first marking patterns 131 can be selected more flexibly for correction process.

Figure 2A:
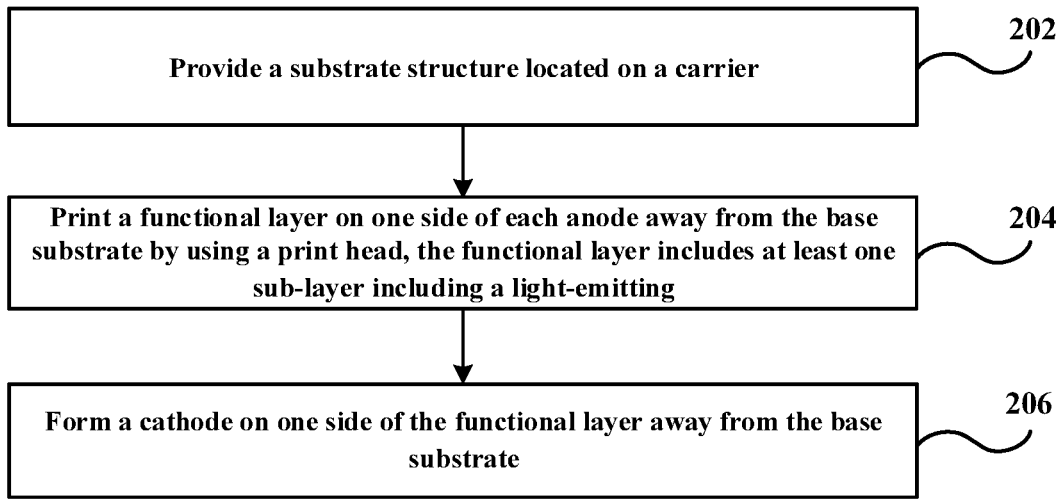
FIG. 2A is a schematic flowchart showing a manufacturing method of a display panel according to an embodiment of the present disclosure.
Figure 2B:
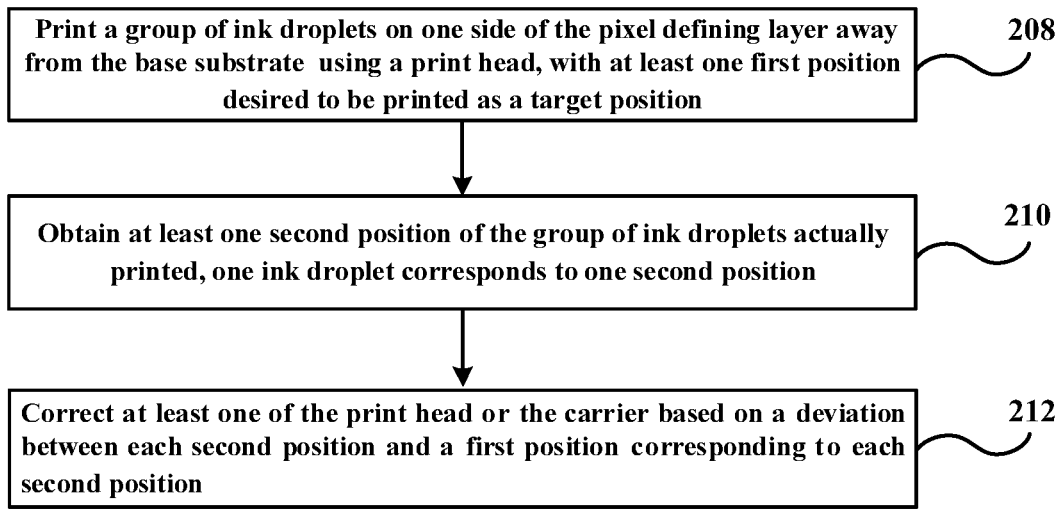
FIG. 2B is a schematic flowchart showing a correction process in a manufacturing method of a display panel according to an embodiment of the present disclosure.

FIG. 2A is a schematic flowchart showing a manufacturing method of a display panel according to an embodiment of the present disclosure. FIG. 2B is a schematic flowchart showing a correction process in a manufacturing method of a display panel according to an embodiment of the present disclosure.

At step 202, a substrate structure located on a carrier is provided.

The substrate structure comprises a base substrate, a plurality of anodes, a marking pattern, and a pixel defining layer. The plurality of anodes and the marking pattern are located on one side of the base substrate, and the pixel defining layer is located on one side of the base substrate.

The marking pattern comprises at least one first marking pattern. The orthographic projection of the marking pattern on the base substrate is within the orthographic projection of the pixel defining layer on the base substrate.

The pixel defining layer defines a plurality of openings. Here, the orthographic projection of each opening on the base substrate at least partially overlaps with the orthographic projection of a corresponding anode on the base substrate.

At step 204, a functional layer is printed on one side of each anode away from the base substrate by using a print head. The functional layer comprises at least one sub-layer comprising a light-emitting layer.

At step 206, a cathode is formed on one side of the functional layer away from the base substrate.

For example, the cathode may be formed by an evaporation process. In some embodiments, before forming the cathode, an electron transport layer and an electron injection layer may also be formed sequentially by an evaporation process.

Before printing one sub-layer of the functional layer in step 204, at least one of the print head or the carrier is corrected.

As shown in FIG. 2B, the correction process comprises steps 208 to 212.

At step 208, a group of ink droplets are printed on one side of the pixel defining layer away from the base substrate by using the print head, with at least one first position desired to be printed as a target position.

The group of ink droplets comprises one or more ink droplets, and the orthographic projection of each ink droplet on the base substrate is within the orthographic projection of the pixel defining layer on the base substrate. Here, one ink droplet corresponds to one first position. For example, one ink droplet is printed at one first position P1 and another ink droplet is printed at another first position P1. It should be understood that, one ink droplet here may be one ink droplet formed by integration of two ink droplets.

In addition, the material of the group of ink droplets is the same as the material of the sub-layer to be printed. For example, the material of the group of ink droplets printed before printing the light-emitting layer is the same as the material of the light-emitting layer. For another example, the material of the group of ink droplets printed before printing the hole transport layer is the same as the material of the hole transport layer.

For example, each first position may be a position with a predetermined distance from a geometric center of a first marking pattern. For another example, the at least one first marking pattern comprises a plurality of first marking patterns, and each first position is a center of a line segment with end points which are geometric centers of two adjacent first marking patterns.

Figure 3:
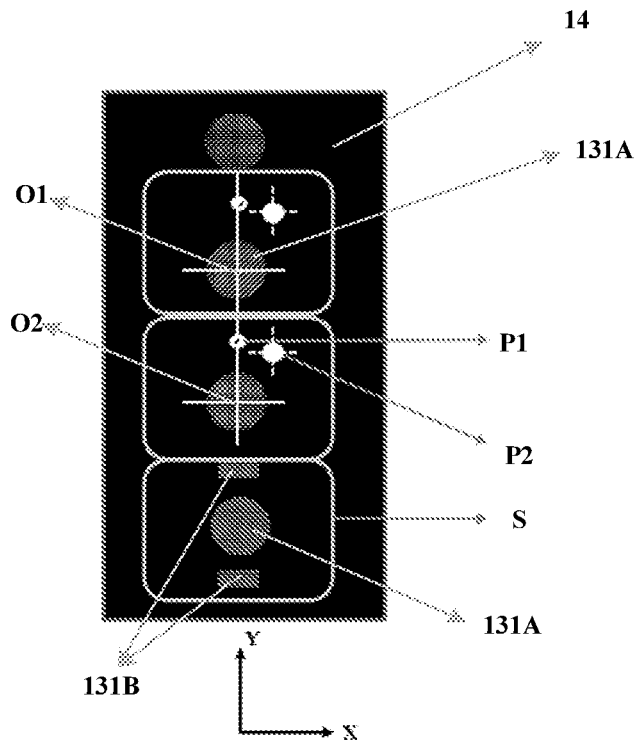
FIG. 3 is a schematic view showing a first position and a second position according to an embodiment of the present disclosure.

FIG. 3 is a schematic view showing a first position and a second position according to an embodiment of the present disclosure.

As shown in FIG. 3, the first position P1 is a center of a line segment with the geometric center O1 and the geometric center O2 as end points thereof. In this way, the printed ink droplets are less likely to overlap with the first marking pattern 131A, thus the positions of the ink droplets can be more accurately determined.

At step 210, at least one second position of the group of ink droplets actually printed is obtained. Here, one ink droplet corresponds to one second position.

For example, after printing this group of ink droplets, an image of the substrate structure may be obtained. The second position of this group of ink droplets actually printed, for example the second position P2 shown in FIG. 3, may be obtained by processing the image. For example, the image of the substrate structure may be obtained by a charge coupled device (CCD) imaging device.

For example, the first marking sub-pattern 131B and the second marking sub-pattern 131B in the frame S may be captured, and then a coordinate system with the geometric center (for example, a center of circle) of the first marking pattern 131A between the first marking sub-pattern 131B and the second marking sub-pattern 131B as a coordinate origin is established, and then the actual printed position of the ink droplet, i.e., the second position P2, is obtained.

In some embodiments, the upper surface of the pixel defining layer has strong lyophobicity, and the printed ink droplets will shrink to be of a hemisphere-like shape. For example, the position of a circle center of an ink droplet can be captured as a second position P2 by obtaining an image containing this ink droplet.

In this way, a first position P1 and a second position P2 corresponding to each ink droplet can be obtained.

At step 212, at least one of the print head or the carrier is corrected based on the deviation between each second position and a first position corresponding to each second position.

For example, according to the coordinates of each second position and a corresponding first position, the deviation between each second position and the corresponding first position may be obtained. Then, according to the obtained deviation, one of the print head and the carrier may be corrected, or both the print head and the carrier may be corrected simultaneously.

It should be understood that, after step 212, a sub-layer may be printed. After printing the sub-layer, steps 208 to 212 may be repeated to perform correction again. In some embodiments, a correction may be performed prior to printing each sub-layer. It should be noted that, the printed ink droplets during each correction process have a same material as the next sub-layer to be printed.

Some implementations of step 212 will be described below in conjunction with FIG. 4. In these implementations, a plurality of first positions is taken as target positions at step 208, and a plurality of second positions is obtained at step 210.

At step 2121, a first difference value between a second abscissa of each second position and a first abscissa of a first position corresponding to each second position is determined to obtain a plurality of first differences.

It should be understood that, each of the plurality of first differences is an abscissa difference between a second position and a corresponding first position.

At step 2122, a second difference between a second ordinate of each second position and a first ordinate of a first position corresponding to each second position is determined to obtain a plurality of second differences.

It should be understood that, each of the plurality of second differences is an ordinate difference between a second position and a corresponding first position.

Figure 4:
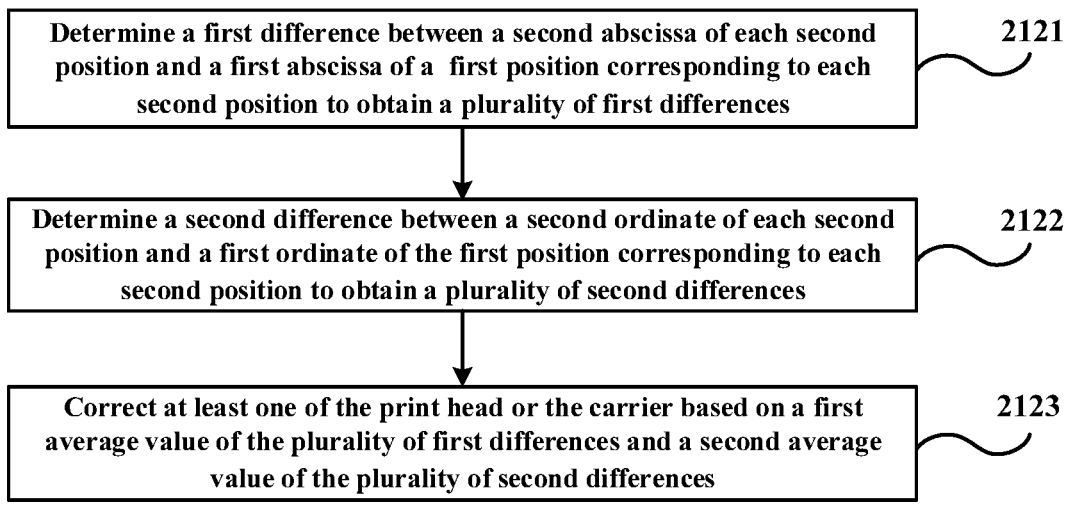
FIG. 4 is a schematic flowchart showing step 212 according to an implementation of the present disclosure.

It should be noted that, although FIG. 4 shows step 2122 to be performed after step 2121, this is not restrictive. The sequence to perform step 2122 and step 2121 is not limited, and step 2122 and step 2121 may be performed simultaneously or sequentially.

At step 2123, at least one of the print head or the carrier is corrected based on a first average value of the plurality of first differences and a second average value of the plurality of second differences.

In the above embodiments, at least one of the print head or the carrier can be corrected more accurately according to the first average value and the second average value.

In some embodiments, an angular deviation between each second position and a first position corresponding to each second position may also be determined, according to a ratio of the second difference to the first difference, to obtain a plurality of angular deviations. In this case, at least one of the print head or the carrier can be corrected based on the first average value, the second average value, and a third average value of the plurality of angular deviations. In this way, in addition to considering the coordinate deviation, the angle deviation is also considered. In the case of inaccurate coordinate deviation, at least one of the print head or the carrier can be corrected more accurately by considering the angle deviation at the same time.

The process of correcting the carrier before printing the light-emitting layer will be explained below by listing an example in conjunction with FIGS. 5A-5C.

Figure 5A:
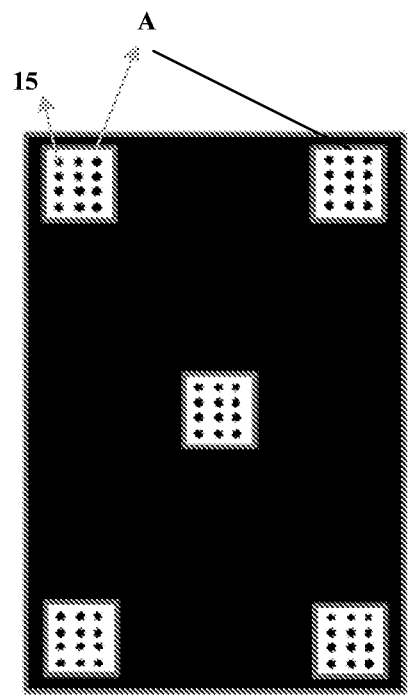
FIGS. 5A-5C are schematic views of correcting a carrier according to an embodiment of the present disclosure.
Figure 5B:
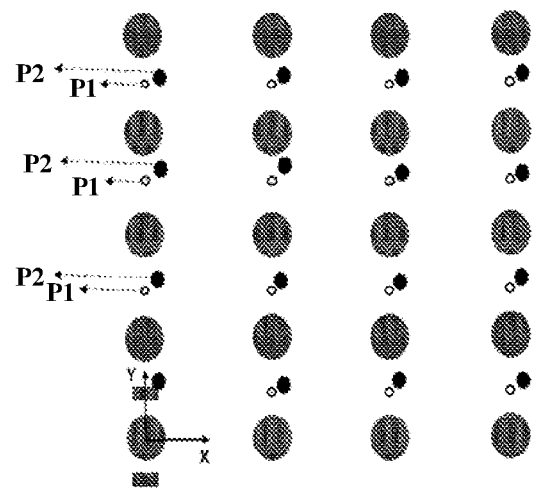
Figure 5C:
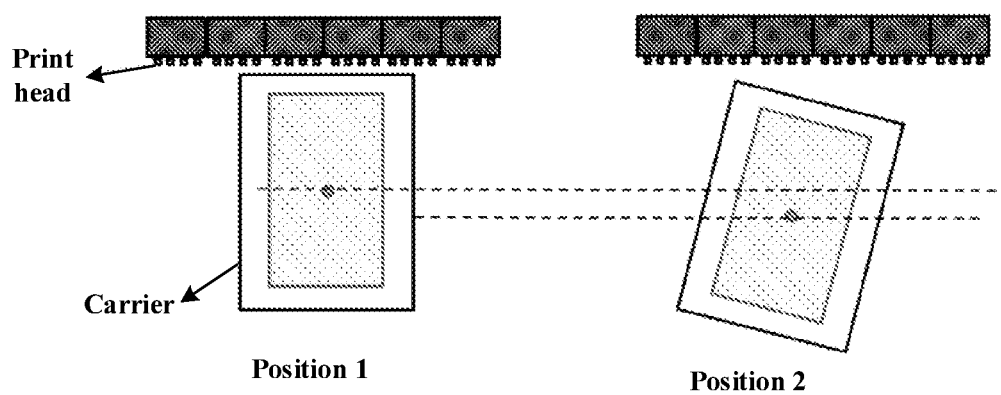

FIGS. 5A-5C are schematic views of correcting a carrier according to an embodiment of the present disclosure.

As shown in FIG. 5A, a group of ink droplets 15 are printed in five regions A spaced apart. The material of this group of ink droplets 15 is the same as the material of the light-emitting layer to be printed.

As shown in FIG. 5B, one region A is taken as an example. The region A has n first positions P1 and n second positions P2. One ink droplet 15 corresponds to one first position P1 and one second position P2.

The abscissas of the n first positions P1 are $X1, X2 \ldots Xn$ in sequence, and the ordinates of the n first positions P1 are $Y1, Y2 \ldots Yn$ in sequence. The abscissas of the n second positions P2 are $X1', X2' \ldots Xn'$ in sequence, and the ordinates of the n second positions P2 are $Y1', Y2' \ldots Yn'$ in sequence.

The first average value of the abscissa deviations of the region A is X, the second average value of the ordinate deviations of the region A is Y, and the third average value of the angular deviations of the region A is Z. X, Y and Z can be respectively expressed by the following formulas:

$$X=[(X1'-X1)+(X2'-X2)+(X3'-X3)+ \ldots +(Xn'-Xn)]/n,$$

$$Y=[(Y1'-Y1)+(Y2'-Y2)+(Y3'-Y3)+ \ldots +(Yn'-Yn)]/n,$$
$$Z=[\arctan(Y1'-Y1)/(X1'-X1)+\arctan(Y2'-Y2)/(X2'-X2)+ \ldots +\arctan(Yn'-Yn)/(Xn'-Xn)]/n.$$

In the above manner, X, Y, and Z of each region A can be obtained, and then the average values of X, Y, and Z of five regions A can be obtained.

As shown in FIG. 5C, the carrier is corrected based on the average values of X, Y, and Z of five areas A.

For example, the position of the carrier may be adjusted. The position 1 is a position of the carrier before adjustment, and the position 2 is a position of the carrier after adjustment. After the position of the carrier is adjusted, the light-emitting layer is subsequently printed, so that the light-emitting layer can be printed at a desired position.

In practical applications, as shown in FIG. 5A, at least one group of ink droplets may be printed in several specific regions of the display panel, thus the time for printing corresponding ink droplets before printing each sub-layer in the functional layer is saved. In addition, according to the actual printing results of other display panels, at least one group of ink droplets may also be printed in a region where an actual position of the ink droplet is different from a desired position.

The embodiments of the present disclosure also provide a display device, which may comprise the display panel according to any one of the above embodiments. In an embodiment, the display device may be any product or member having a display function, such as a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
   a base substrate;
   a plurality of anodes and a marking pattern which are located on one side of the base substrate, wherein the marking pattern comprises at least one first marking pattern;
   a pixel defining layer located on the one side of the base substrate, and defining a plurality of openings, wherein an orthographic projection of each opening of the plurality of openings on the base substrate at least partially overlaps with an orthographic projection of an anode of the plurality of anodes corresponding to the each opening on the base substrate, and an orthographic projection of the marking pattern on the base substrate is within an orthographic projection of the pixel defining layer on the base substrate;
   at least one group of ink droplets located on one side of the pixel defining layer away from the base substrate, wherein each group of ink droplets comprises one or more ink droplets, and an orthographic projection of each ink droplet of the one or more ink droplets on the base substrate is located within the orthographic projection of the pixel defining layer on the base substrate;
   a functional layer located on one side of each anode of the plurality of anodes away from the base substrate, wherein the functional layer comprises at least one sub-layer comprising a light-emitting layer, and a material of each group of ink droplets is the same as a material of one of the at least one sub-layer; and
   a cathode located on one side of the functional layer away from the base substrate.

2. The display panel according to claim 1, wherein:
   an orthographic projection of each first marking pattern on the base substrate is of a first shape; and
   the marking pattern further comprises at least one second marking pattern, wherein an orthographic projection of each second marking pattern on the base substrate is of a second shape different from the first shape.

3. The display panel according to claim 2, wherein:
the plurality of openings comprises M×N openings, wherein M is a row number of the plurality of openings, N is a column number of the plurality of openings, and M and N each is an integer greater than or equal to 2;
the at least one first marking pattern comprises a plurality of first marking patterns comprising M'×N' first marking patterns, wherein two adjacent rows of first marking patterns are spaced apart by at least one row of openings, two adjacent columns of first marking patterns are spaced apart by at least one column of openings, M' is a row number of the plurality of first marking patterns, N' is a column number of the plurality of first marking patterns, and M' and N' each is an integer greater than or equal to 2; and
the at least one second marking pattern comprises a plurality of second marking patterns.

4. The display panel according to claim 3, wherein:
each second marking pattern comprises a first marking sub-pattern and a second marking sub-pattern; and
only one of the plurality of first marking patterns is located between the first marking sub-pattern and the second marking sub-pattern.

5. The display panel according to claim 4, wherein an area of an orthographic projection of each of the first marking sub-pattern and the second marking sub-pattern on the base substrate is smaller than an area of the orthographic projection of each first marking pattern on the base substrate, wherein:
the first marking sub-pattern is located in a same row as one row of openings of the plurality of openings, and the second marking sub-pattern is located in a same row as another row of openings of the plurality of openings adjacent to the one row of openings, or
the first marking sub-pattern is located in a same column as one column of openings of the plurality of openings, and the second marking sub-pattern is located in a same column as another column of openings of the plurality of openings adjacent to the one column of openings.

6. The display panel according to claim 3, wherein a distance between geometric centers of orthographic projections of any two adjacent first marking patterns in a same row of first marking patterns on the base substrate is a same first distance.

7. The display panel according to claim 6, wherein a distance between geometric centers of orthographic projections of any two adjacent openings in a same row of openings on the base substrate is the same first distance.

8. The display panel according to claim 6, wherein a distance between geometric centers of orthographic projections of any two adjacent first marking patterns in a same column of first marking patterns on the base substrate is a same second distance.

9. The display panel according to claim 8, wherein a distance between geometric centers of orthographic projections of any two adjacent openings in a same column of openings on the base substrate is the same second distance.

10. The display panel according to claim 3, wherein M=M', N=N', M rows of openings and M' rows of first marking patterns are alternately arranged, and N columns of openings and N' columns of first marking patterns are alternately arranged.

11. The display panel according to claim 10, wherein:
in a case where i is any value from 1 to M, a number of openings in i-th row of openings is the same as a number of first marking patterns in i-th row of the first marking patterns; and
in a case where j is any value from 1 to N, a number of openings in j-th column of openings is the same as a number of the first marking patterns in j-th-column of the first marking patterns.

12. The display panel according to claim 1, wherein an orthographic projection of each ink droplet on the base substrate does not overlap with an orthographic projection of each first marking pattern on the base substrate.

13. The display panel according to claim 1, wherein:
the at least one sub-layer further comprises a hole injection layer, and a hole transport layer located between the hole injection layer and the light-emitting layer; and
the at least one group of ink droplets comprises a first group of ink droplets, a second group of ink droplets and a third group of ink droplets that do not overlap each other, wherein a material of the first group of ink droplets is the same as a material of the light-emitting layer, a material of the second group of ink droplets is the same as a material of the hole injection layer, and a material of the third group of ink droplets is the same as a material of the hole transport layer.

14. The display panel according to claim 2, wherein the orthographic projection of each ink droplet on the base substrate is of the first shape, and the first shape is a circle.

15. The display panel according to claim 1, wherein the marking pattern is located in a same layer as the plurality of anodes.

16. A display device, comprising the display panel according to claim 1.

17. A manufacturing method of a display panel, comprising:
providing a substrate structure located on a carrier, the substrate structure comprising:
a base substrate,
a plurality of anodes and a marking pattern which are located on one side of the base substrate, wherein the marking pattern comprises at least one first marking pattern, and
a pixel defining layer located on the one side of the base substrate, and defining a plurality of openings, wherein an orthographic projection of each opening of the plurality of openings on the base substrate at least partially overlaps with an orthographic projection of an anode of the plurality of anodes corresponding to the each opening on the base substrate, and an orthographic projection of the marking pattern on the base substrate is within an orthographic projection of the pixel defining layer on the base substrate;
printing a functional layer on one side of each anode of the plurality of anodes away from the base substrate using a print head, wherein the functional layer comprises at least one sub-layer comprising a light-emitting layer;
forming a cathode on one side of the functional layer away from the base substrate; and
before printing one of the at least one sub-layer, correcting at least one of the print head or the carrier, comprising:
printing a group of ink droplets on one side of the pixel defining layer away from the base substrate using the print head with at least one first position desired to be printed as a target position, wherein the group of ink droplets comprises one or more ink droplets, a material of the group of ink droplets is the same as a material of the one of the at least one sub-layer, one ink droplet corresponds to one first position, and an orthographic projection of each ink droplet of the one or more ink droplets on the base substrate is located within the orthographic projection of the pixel defining layer on the base substrate, obtaining at least one second position of the group of ink droplets actually printed, wherein one ink droplet corresponds to one second position, and correcting at least one of the print head or the carrier based on a deviation between each second position and a first position corresponding to each second position.

18. The manufacturing method according to claim 17, wherein the at least one first marking pattern comprises a plurality of first marking patterns, and each of the at least one first position is a center of a line segment with end points which are geometric centers of two adjacent first marking patterns of the plurality of first marking patterns.

19. The manufacturing method according to claim 17, wherein the at least one first position comprises a plurality of first positions, and the at least one second position comprises a plurality of second positions; and the correcting at least one of the print head or the carrier based on a deviation between each second position and a first position corresponding to each second position comprises:

determining a first difference between a second abscissa of each second position and a first abscissa of the first position corresponding to each second position to obtain a plurality of first differences;

determining a second difference between a second ordinate of each second position and a first ordinate of the first position corresponding to each second position to obtain a plurality of second differences; and correcting at least one of the print head or the carrier based on a first average value of the plurality of first differences and a second average value of the plurality of second differences.

20. The manufacturing method according to claim 19, wherein:

the correcting at least one of the print head or the carrier based on a deviation between each second position and a first position corresponding to each second position further comprises:

determining an angular deviation between each second position and the first position corresponding to each second position according to a ratio of the second difference to the first difference to obtain a plurality of angular deviations; and the correcting at least one of the print head or the carrier based on a first average value of the plurality of first differences and a second average value of the plurality of second differences comprises:

correcting at least one of the print head or the carrier based on the first average value, the second average value, and a third average value of the plurality of angular deviations.

* * * * *